July 28, 1970 G. G. SUMNER 3,522,164
SEMICONDUCTOR SURFACE PREPARATION AND DEVICE FABRICATION
Filed Oct. 21, 1965 2 Sheets-Sheet 1

INVENTOR
George G. Sumner
BY William E. Johnson Jr.
ATTORNEY

SEMICONDUCTOR SURFACE PREPARATION AND DEVICE FABRICATION

Filed Oct. 21, 1965 2 Sheets-Sheet 2

INVENTOR
George G. Sumner
BY William E. Johnson, Jr.
ATTORNEY

United States Patent Office 3,522,164
Patented July 28, 1970

3,522,164

SEMICONDUCTOR SURFACE PREPARATION AND DEVICE FABRICATION

George G. Sumner, Richardson, Tex., assignor to Texas Instruments Incorporated, Dallas, Tex., a corporation of Delaware Filed Oct. 21, 1965, Ser. No. 499,632
Int. Cl. C23c *15/00*
U.S. Cl. 204—192 2 Claims

ABSTRACT OF THE DISCLOSURE

Disclosed is a method of fabricating a semiconductor device characterized by the steps of:

(a) heating a wafer of compound semiconductor material in a vacuum to sublime a portion of the surface of the compound semiconductor material of said wafer and thereby rid the surface of the wafer of impurities which otherwise would deleteriously affect the performance later, and thereafter, (b) epitaxially depositing a semiconductor layer onto a cleaned surface of the wafer.

Specific operating conditions for compound semiconductors are given; for example, in fabricating a gallium arsenide semiconductor device, a gallium arsenide slice is heated to a temperature of 200–500° C. for 15 to 30 minutes in a vacuum less than $10^{-6}$ torr, and thereafter gallium arsenide is sputtered onto the substrate maintained at a temperature of 200–350° C.

This invention relates to the fabrication of semiconductor devices. More particularly it relates to a method of improving a semiconductor surface as an integral part of semiconductor device fabrication.

In the semiconductor technology it is advantageous to have a wafer or slice of single crystal material which is well-ordered, strain-free and clean. In epitaxial deposition, wherein a thin film of material, for example, gallium arsenide, is deposited upon a gallium arsenide substrate, it is especially desirable to have a substrate surface which is highly oriented, that is, the surface is ordered such that for all practical purposes it is truly single crystal, having uniformity of atomic crystalline structure. Following the definition of epitaxial deposition, the thin film which is deposited will follow the crystalline structure of the substrate. Thus, it is axiomatic that a random-oriented substrate will cause the deposited film to be less than well-ordered. Likewise, whether the subsequent fabrication processes be epitaxial, cathodic sputtering, diffusion or another of the refined semiconductor processes, a clean, well-ordered surface will provide a starting material which will result in improved semiconductor devices.

The problem of providing a surface as above described is more commonly encountered with the typical semiconductor slice than with the cleaved surface, but since the cleaved surface is not as practical for device fabrication as is the polished slice (wafer), the improvement of a polished slice is presented as being the epitome of the problem as experienced in the fabrication of a semiconductor device.

Whether a slice of semiconductor material is mechanically or chemically polished, the polished slice is in fact, generally neither clean nor well-ordered. These polishing methods produce surface contamination and surface strains (commonly termed the work surface) which should be removed for optimum device characteristics.

Epitaxial deposition of the semiconductor material on a semiconductor substrate is useful, sometimes necessary, in the fabrication of semiconductor devices. Unfortunately, the processes most extensively used at the present for such deposition, for example by hydrogen reduction of a silicon halide, require temperatures which approach the melting point of the semiconductor. At these elevated temperatures, diffusion of dopant materials in the substrate or in the deposited layer occurs quite rapidly. This diffusion is generally undesirable if selective areas of the substrate have been previously doped, or if the deposited layer is of different conductivity type then the substrate. Accordingly, it would be preferable to make the epitaxial deposition at quite low temperatures, perhaps approaching room temperature, so that negligible impurity diffusion would occur during the deposition.

It is therefore an object of the invention to provide a method of improving the surface of a semiconductor wafer.

It is a further object of the invention to provide an improved process for fabricating a metal-semiconductor device.

It is yet another object of the invention to provide a method for depositing, as by sputtering, a semiconductor material onto a semiconductor substrate at reduced temperatures.

Still another object of the invention is to provide a method of fabricating a semiconductor wafer having a strain-free surface.

It is yet another object of the invention to provide a method of fabricating a semiconductor wafer having improved uniformity of crystalline structure on the surface.

These and other objects, features and advantages of the invention will become more readily understood when taken in conjunction with the following detailed description, appended claims and attached drawings, in which:

Similar reference characters indicate corresponding parts throughout the several views of the drawings.

Figure 1:
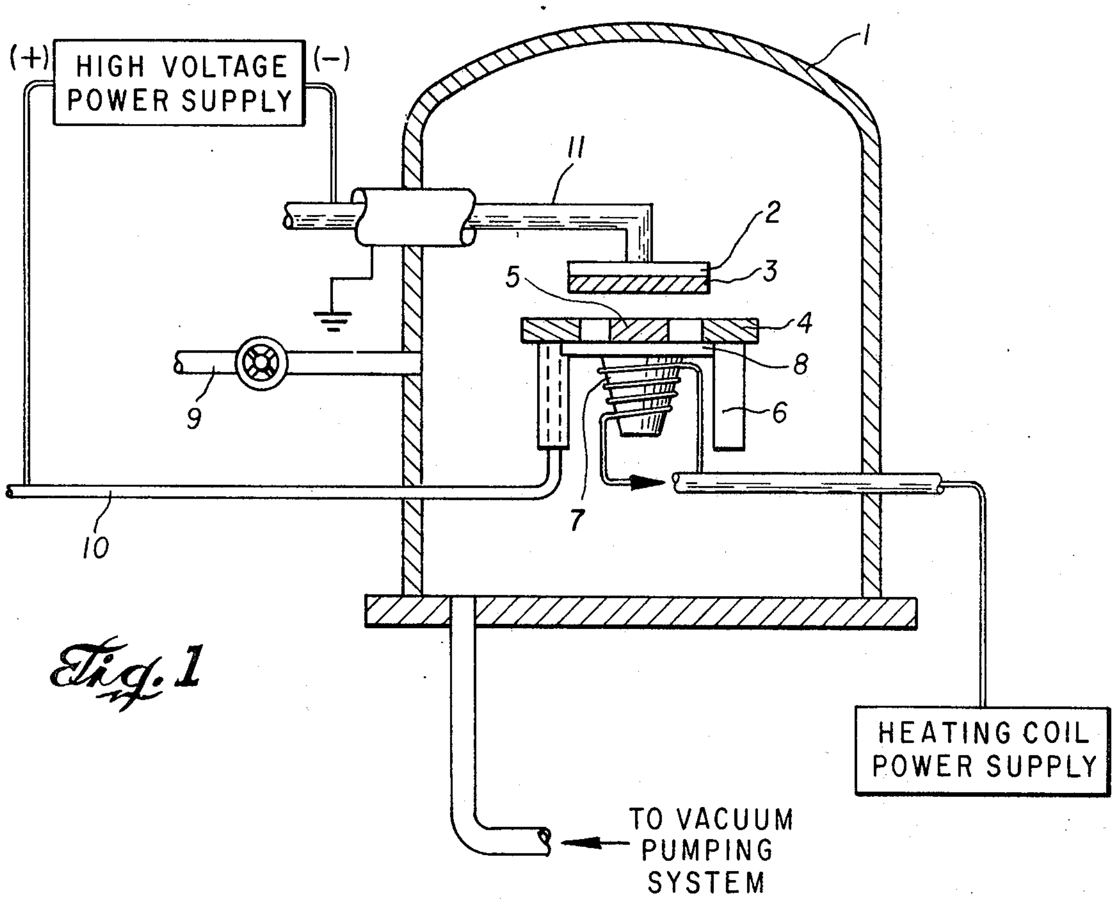
FIG. 1 illustrates a partially sectioned view of an apparatus for performing the vacuum-thermal sublimation-sputtering process according to the invention.

Dimensions of certain of the parts as shown in the drawings have been modified for the purpose of clarity of illustration.

Briefly, the invention pertains to a method of thermally subliming a semiconductor substrate surface in a vacuum prior to the subsequent fabrication processes such as, for examples, sputtering, epitaxial deposition or diffusion. Thermal sublimation in a vacuum produces a clean, strain-free, well-ordered (oriented) slice especially adaptable for epitaxial deposition, single crystal cathodic sputtering or impurity diffusion.

Figure 2:
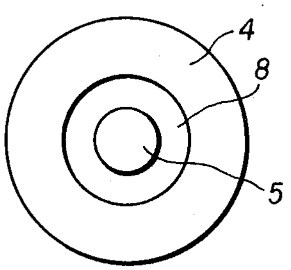
FIG. 2 illustrates an elevational view of the substrate holder and substrate material according to FIG. 1.

For a more detailed description, with specific reference to FIG. 1, there is illustrated an apparatus for carrying out one embodiment of the invention, namely, a vacuum-thermal sublimation of a polished slice (wafer) of semiconductor substrate material followed by a low temperature sputtering of semiconductor material onto that substrate. The term "sputtering" refers to a process whereby an electrical discharge is passed between electrodes at a low environmental gas pressure and the cathode is disintegrated under the bombardment of ionized gas molecules, the disintegrated particles of the cathode leaving its surface either as free atoms or in chemical combination with the environmental gas molecules. Some of the liberated atoms are returned to the cathode by collision with gas molecules. Others are deposited on surrounding surfaces adjacent the cathode. When a chemically inert gas, such as argon, is used as the environmental gas, the particles libertated from the cathode are deposited on the anode in pure elemental form. This process is known as "physical" sputtering. However, when the environmental gas is comprised of a mixture of inert gas and a reactive gas, such as oxygen, the atoms liberated from the cathode react with the oxygen and are deposited as oxides of the cathode material. This process is termed "reactive" sputtering. Although the present thermal sublimation in a vacuum process can be followed by a reactive sputtering process, the preferred embodiment of the present invention utilizes a physical sputtering accomplished in an inert argon atmosphere. A semiconductor wafer 5, for example, a slice of gallium arsenide, which has been either chemically or mechanically polished (not illustrated) and which has been etched in a commonly used etch solution such as, for example, $H_2SO_4$:$H_2O$:$H_2O_2$ (8:1:1) or a (4:1) mixture of 50% NaOCI:$H_2O$, is placed in the vacuum chamber 1 upon and in the holder 4, an elevational view of the same being illustrated in FIG. 2. A heating coil assembly 8 is used to heat the substrate material 5, to be discussed further hereinafter. A gallium arsenide cathode 3, being approximately two inches by two inches, and mounted on a holder 2, is placed approximately for centimeters from the substrate material 5. The vacuum chamber is then pumped down to approximately $10^{-8}$ torr or thereabouts for 30 minutes while the substrate material 5 is heated to approximately 300° C., the heating in the vacuum causing a thermal sublimation which drives off the non-clean disordered work surface from the substrate 5 which had been the result of the prior polishing process. The reduced atmosphere creates a long mean path for the particles sublimed from the substrate surface, reducing the possibility of the contaminants returning to the surface during subsequent processing. It has been found by the inventor that this thermal sublimation in a vacuum makes it possible to sputter the gallium arsenide 3 onto the substrate 5 at a much reduced temperature than has been previously possible. For example, while holding the anode 8 to cathode 3 potential at 3 kv., 2 ma. in 3 microns of argon for 4 hours, the sputtering was effective while holding the substrate at only 200° C. Accordingly, the substrate temperature is not now thought to be critical, but rather is incidental to the sputtering process, provided the substrate surface has been processed according to the invention. The low substrate temperatures which can now be used will contribute to the fabrication of the Schottky barrier used in the metal base transistor art currently being developed, the low temperature being highly desirable because high temperatures cause a diffusion effect which tends to destroy the Schottky barrier. As an example, a gold layer on a gallium arsenide substrate will begin to diffuse into the substrate at approximately 350° C., destroying the barrier. Therefore, the ability to deposit the gold layer at a reduced temperature will keep the barrier from being destroyed. As illustrated further in FIG. 1, the high voltage is delivered to the anode and cathode by supply lines 10 and 11. After the system pressure has been reduced via the vacuum pumping system, a small amount of inert gas, for example argon, is allowed to enter the chamber 1 through the pipe 9 to create an argon atmosphere of approximately three microns.

It should be appreciated that the exact reduced pressure in the vacuum chamber is not critical and that satisfactory results can be obtained in the range starting around $10^{-6}$ torr during the thermal sublimation period of approximately 15–30 minutes, the period preceding the introduction of the argon. When the temperature-pressure combination causes the material surface to reach its equilibrium substrate vapor pressure (approximately at $10^{-8}$ torr) the optimum product has been produced.

While the technique thus described is especially useful in current technology wherein thermal sublimation occurs at an effective rate at temperatures less than 500–600° C., the technique is general and can be used to prepare low vapor pressure crystal surfaces such as MgO and Si provided the active components of the residual gas are present in low enough concentrations to eliminate the possibility of undesirable surface reactions (for example, oxidation) at temperatures corresponding to equilibrium vapor pressures of approximately $10^{-8}$ torr. Alternatively, low vapor pressure substrate surfaces can be prepared by vacuum thermal sublimation at much lower rates using lower temperatures for longer periods of time. This indicates the use of ultra-high vacuum systems for such processes.

Figures 3, 4:
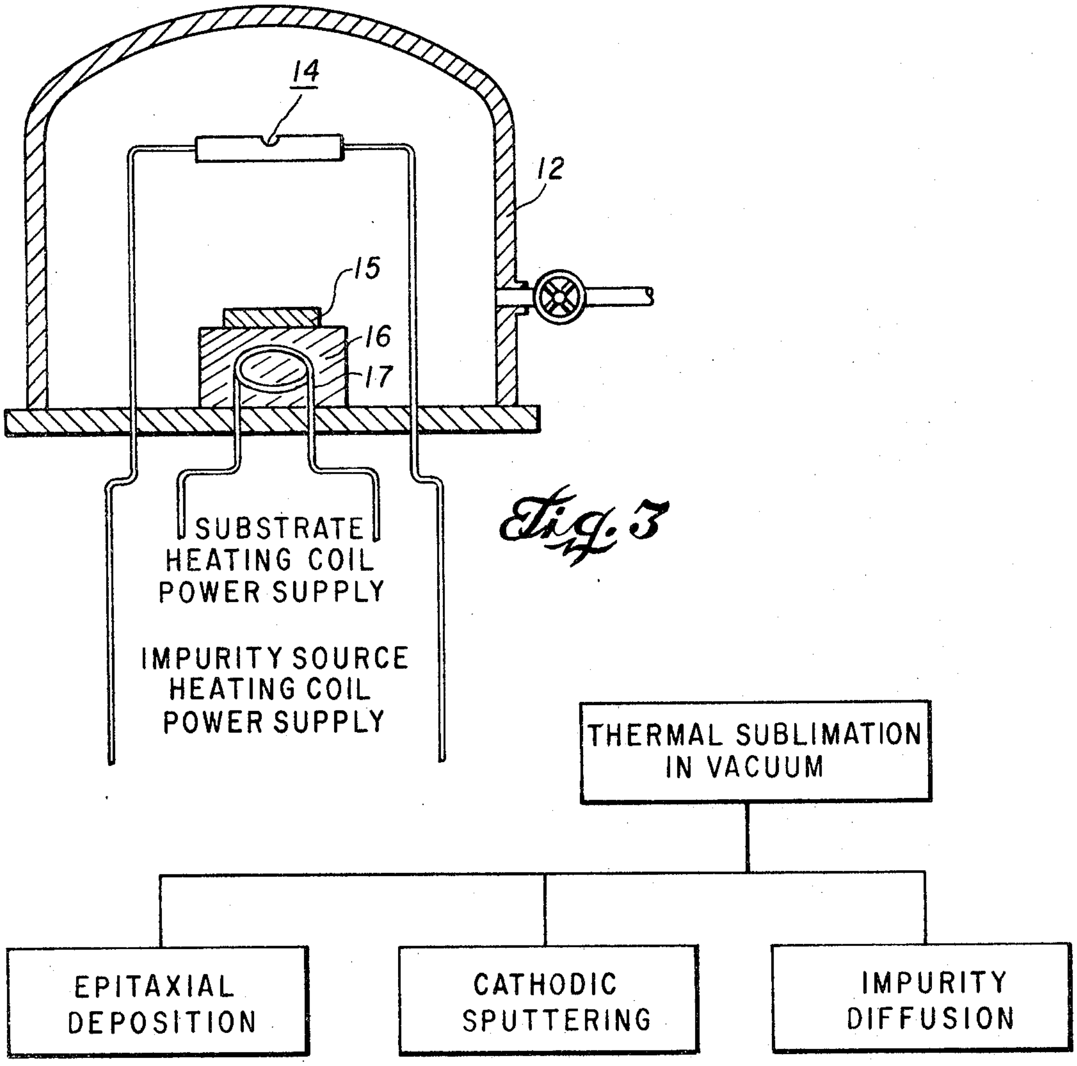
FIG. 3 illustrates a partially sectioned view of an apparatus for performing the vacuum-thermal sublimation-diffusion process according to the invention.
FIG. 4 illustrates a flow chart of the processes of the invention.

FIG. 3 illustrates another embodiment of the invention wherein a polished slice of semiconductor material 15, for example, P-type silicon, is placed in a vacuum chamber 12. The material 15 is placed upon a holder 16 having a heating coil 17 therein to heat the material during the thermal sublimation and subsequent diffusion, or in the alternative, a subsequent epitaxial deposition. The material 15 is heated to approximately 300° C. for approximately 30 minutes in a pressure of approximately $10^{-6}$ to $10^{-8}$ torr to sublime the surface, thus resulting in a clean, strain-free, well-ordered surface. The boat-heating coil assembly 14 contains an N-type impurity source such as, for example, arsenic. After the thermal sublimation process, the arsenic is heated to its evaporation point and the arsenic particles are then allowed to contact the surface of the substrate 15. The substrate is then further heated, for example, to 800° C., to cause the N-type impurities to diffuse into the substrate, the diffusion step being well known in the art. The epitaxial processes, also well known in the art, are especially adaptable to the thermal sublimation process immediately preceding the epitaxial deposition, and could be processed in much the same type apparatus as shown in FIG. 3, the details of the epitaxial process being more fully described in the co-pending application Ser. No. 237,161, filed Nov. 13, 1962, and assigned to the assignee of the present application.

It is thus to be appreciated that any of the semiconductor fabrication processes, as exampled by sputtering, epitaxial deposition or diffusion are enhanced by a vacuum thermal sublimation prior to those aforenamed processes.

Figure 5:
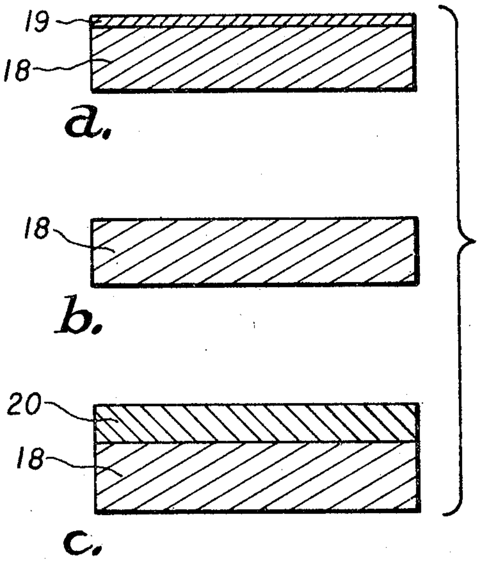
FIG. 5 illustrates a schematic representation of a semiconductor wafer processed according to the processes of the invention.

FIGS. 4 and 5 illustrate a flow chart and a schematic representation of a semiconductor slice which indicate the process steps of the invention. In FIG. 5, the polished slice 18 has a surface contamination layer 19 commonly caused by the slice polish operation. The subsequent etch and vacuum thermal sublimation process step of the present invention removes the layer 19, leaving the clean substrate material of FIG. 5 (B). Subsequently, the layer 20 of FIG. 5 (C) is formed on or into the substrate 18, for example, by sputtering, epitaxial deposition or diffusion.

While the invention has been described with respect to gallium arsenide and silicon, the invention has successfully produced layers of nickel, platinum, gold, gallium arsenide, cadmium telluride, and indium antimonide on rock salt (NaCl) substrates and gold and cadmium telluride on gallium arsenide substrates, the sublimation temperature generally being in the 300–500° C. range and the deposition temperatures being generally in the range of 200–400° C. Thus, although the invention has been described and illustrated according to the preferred embodiments, such embodiments are given by way of example, and not by way of limitation, and the invention should be construed to be limited only by the appended claims.

What is claimed is:

1. In a method for fabricating a metal-semiconductor device, the steps of:

(a) heating a semiconductor slice in a vacuum having a pressure between about $10^{-6}$ torr and $10^{-10}$ torr to remove at least a portion of the semiconductor material on at least one surface of said slice to effect a clean ordered surface at said at least one surface of said slice; and (b) depositing a metal onto said clean ordered surface of said slice while maintaining said slice at a temperature below 350° C.

2. The method according to claim 1 wherein said metal is gold.

References Cited

UNITED STATES PATENTS

| | | | |
|---|---|---|---|
| 3,021,271 | 2/1962 | Wehner | 204—192 |
| 3,067,485 | 12/1962 | Ciccolella et al. | 148—186 XR |
| 3,116,184 | 12/1963 | Miller | 156—17 XR |
| 3,151,006 | 9/1964 | Grabmaier et al. | 148—174 |
| 3,205,101 | 9/1965 | Mlavsky et al. | 148—174 XR |
| 3,271,208 | 9/1966 | Allegretti | 148—175 |
| 3,287,186 | 11/1966 | Minton et al. | 148—174 |
| 3,148,094 | 9/1964 | Kendall | 148—175 |
| 3,208,888 | 9/1965 | Ziegler et al. | 148—175 |
| 3,372,069 | 3/1968 | Bailey et al. | 148—175 |

L. DEWAYNE RUTLEDGE, Primary Examiner

W. G. SABA, Assistant Examiner

U.S. Cl. X.R.

148—175; 156—17